United States Patent [19]
Patrick et al.

[11] Patent Number: 5,904,571
[45] Date of Patent: May 18, 1999

[54] METHODS AND APPARATUS FOR REDUCING CHARGING DURING PLASMA PROCESSING

[75] Inventors: Roger Patrick, Mountain View; Phillip L. Jones; Kambiz Fallahpour, both of Fremont; Yun-Yen Yang, San Jose; Wen-Ben Chou, Palo Alto, all of Calif.

[73] Assignee: Lam Research Corp., Freemont, Calif.

[21] Appl. No.: 08/671,872

[22] Filed: Jun. 28, 1996

[51] Int. Cl.⁶ .............................. H01L 21/00; H05H 1/00
[52] U.S. Cl. .................. 438/731; 438/729; 438/730; 216/67; 216/68; 156/345
[58] Field of Search .................. 156/345; 118/723 I, 118/723 IR, 723 E; 204/298.06, 298.08, 298.34; 438/729, 730, 731

[56] References Cited

U.S. PATENT DOCUMENTS 5,315,145   5/1994   Lukaszek ................................ 257/379

*Primary Examiner*—Thi Dang
*Attorney, Agent, or Firm*—Beyer & Weaver LLP, Inc.

[57] ABSTRACT

An apparatus and method in a plasma processing chamber for reducing charging of a wafer is described. A plasma generating element is configured to cause a plasma including ions and free radicals to be formed in a plasma generating region. A plasma diffusion region is configured so that plasma generated in the plasma generating region can diffuse through the plasma diffusion region. A conductive grid is positioned within the plasma diffusion region between the wafer and the plasma generating region. The conductive grid includes a mesh which is configured to trap a portion of the ions so that a portion of the ions are prevented from diffusing through the diffusion region to reach the wafer.

22 Claims, 3 Drawing Sheets

METHODS AND APPARATUS FOR REDUCING CHARGING DURING PLASMA PROCESSING

BACKGROUND OF THE INVENTION

The present invention relates to the fabrication of semiconductor integrated circuits (IC's). More particularly, the present invention relates to methods and apparatus for reducing charging during plasma processing.

Plasma processing is an important step in the processing of semiconductor wafers, flat panel displays, and other semiconductor components. In a process referred to as "stripping" or "ashing," plasma processing is used to remove photoresist or other material from the surface of a wafer. Plasma processing is also used for etching surface portions of a wafer, and other processes known to those skilled in the art. Although specific plasma processes involving wafers will be referred to herein, the apparatus and method disclosed herein is intended for use in any plasma process where it is desired that charging of the object being processed be reduced. The plasma used in these processes generally includes both ions, which are charged, and reactive free radicals, which are neutral. Ions transport charge to the wafer and in some cases cause a significant charge to build up on the wafer.

An example of a plasma processing chamber 100 is shown in FIG. 1. A plasma source gas 101 is introduced into plasma processing chamber 100 through a gas input port 102 and a gas ring 104. Gas ring 104 is shown as a toroid with a set of gas outlet holes 106 located on the inside of the toroid. Other gas diffusers may also be employed by those skilled in the art, including shower head shaped diffusers or diffusers built into the side of the chamber itself. A plasma generating element 108 creates an electromagnetic field which causes plasma source gas 101 to form a plasma. Plasma generating element 108 is shown as a Transformer Coupled Plasma (TCP) coil, but plasma generating element 108 may also be any other type of plasma generating element including inductively coupled Radio Frequency (RF), Helicon, Electron Cyclotron Resonance (ECR), or microwave. Plasma generating element 108 is connected to RF power source 110, or any other appropriate power source for the specific plasma generating element 108 being used, which provides the power for generating the plasma.

The plasma is generated in a plasma generating region 112, which is in proximity to gas ring 104 and plasma generating element 108. The approximate boundary of plasma generating region 112 within plasma processing chamber 100 is shown by a dashed line 113. The plasma diffuses from plasma generating region 112 into a plasma diffusion region 114, where the plasma reacts with a wafer 116. Wafer 116 is held by a wafer transport arm 118, or alternatively may be held on a chuck. The chuck can be electrically grounded or connected to a power source. To keep pressure in plasma processing chamber 100 low, the plasma and byproduct material is exhausted through an exhaust port 120.

Although a wafer has been described as being processed in plasma processing chamber 100, plasma processing chamber 100 may also be used to process flat panel displays or other semiconductor components which require etching, stripping, ashing, or other forms of plasma processing. Throughout this specification and the claims, when the term "wafer" is used, it should be understood to include wafers or any component which may undergo plasma processing.

As noted above, the plasma is made up of both charged ions and reactive free radicals. The reactive free radicals react with materials on the surface of the wafer but do not carry charge to the wafer. The ions, however, carry charge to the wafer, and, when the wafer does not have a good electrical connection to ground or a potential source, a substantial charge may build up either on the entire wafer or on certain devices on the wafer.

In certain plasma processes, such as anisotropic etching, the charged property of the ions is useful. A voltage source is connected to the wafer which accelerates the ions towards the wafer and causes anisotropic, or directional etching to occur. In other processes, the free radicals and not the ions are more desirable for performing the important plasma processing function. This is the case in some resist stripping processes. In some cases, therefore, the ions may not be essential to the plasma process and may in fact be detrimental because they can destroy structures on the wafer by charging the wafer.

Charging of the wafer is a well known problem which can lead to degradation of device performance. This is especially a problem when there are large antennas of conducting material such as metal or polysilicon on a wafer attached to a single transistor gate which utilizes a very thin (<100 Å or <50 Å) gate oxide. The large antennas collect relatively large amounts of charge by virtue of their large area and funnel the charge down to the small transistor. Performance degradation or destruction often results. A process where such an antenna is exposed to a plasma including ions for a long period of time such as in the overetching portion of a resist removal step causes particular problems with devices.

Attempts to remove ions from the plasma have been made. Insulating quartz baffles have been used within plasma processing chamber 100 to remove ions with some success, but insulating baffles in the prior art allow a significant portion of the ions to pass.

A method and apparatus are needed for alleviating the wafer charging problem.

SUMMARY OF THE INVENTION

The invention relates, in one embodiment, to an apparatus and method for reducing charging of a wafer. A plasma generating element is configured to cause a plasma including ions and free radicals to be formed in a plasma generating region. A plasma diffusion region is configured so that plasma generated in the plasma generating region can diffuse through the plasma diffusion region. A conductive grid is positioned within the plasma diffusion region between the wafer and the plasma generating region. The conductive grid includes a mesh which is configured to trap a portion of the ions so that a portion of the ions is prevented from diffusing through the diffusion region to reach the wafer.

In another embodiment, the invention includes a current measuring device for measuring the number of ions which are extracted by the conductive grid.

Ions may thus be removed from the plasma before they reach the wafer and cause damage. The number of ions removed from the plasma may be measured so that optimum grid characteristics can be determined for any set of conditions and grid performance can be monitored.

These and other advantages of the present invention will become apparent upon reading the following detailed descriptions and studying the various drawings.

DETAILED DESCRIPTION OF THE PREFERRED EMBODIMENTS

In view of the foregoing, an invention is described which solves the problem of wafer charging during plasma processing. Charge-carrying ions are filtered from the plasma by a conductive grid introduced between the plasma source and the wafer surface. Filtering of the ions is accomplished because reactive free radicals can pass through the grid, but charged particles formed in the plasma source are extracted by the grid.

In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 2:
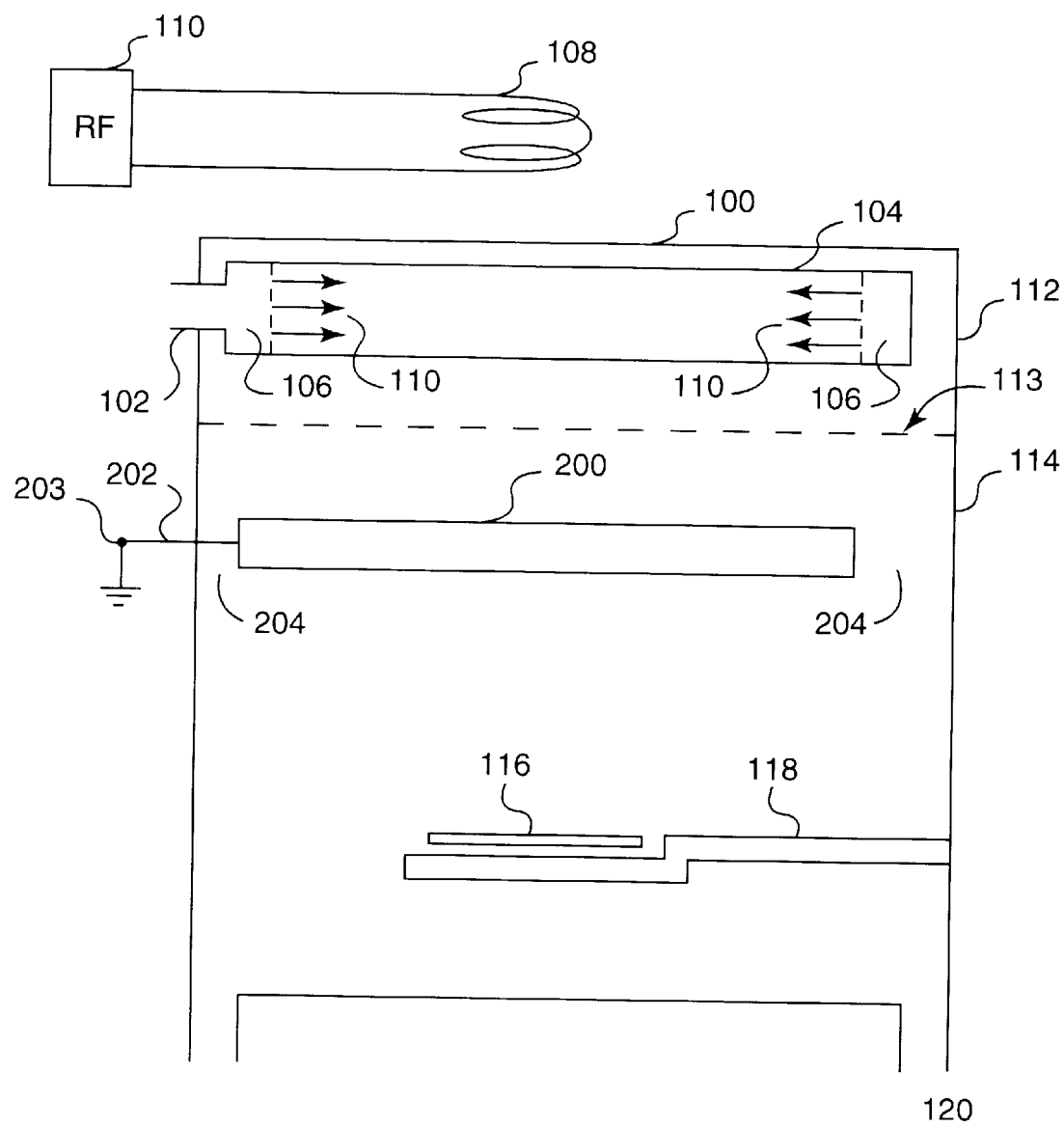
FIG. 2 shows, in one embodiment, plasma diffusion region with a conductive grid.

FIG. 2 shows plasma diffusion region 114 with a conductive grid 200 of the present invention. Conductive grid 200 is located within plasma diffusion region 114 so that, as the plasma generated in plasma generating region 112 diffuses through plasma diffusion region 114 towards wafer 116, the plasma ions will be extracted by the grid. Conductive grid 200 is shown placed within plasma diffusion region 114 sufficiently distant from plasma generating region 112 so that significant plasma generation does not occur within the holes of conductive grid 200. Conductive grid 200 is placed substantially outside plasma generating region 112. This is because plasma ions generated within the spaces of conductive grid 200 will not be extracted by conductive grid 200.

Figure 1:
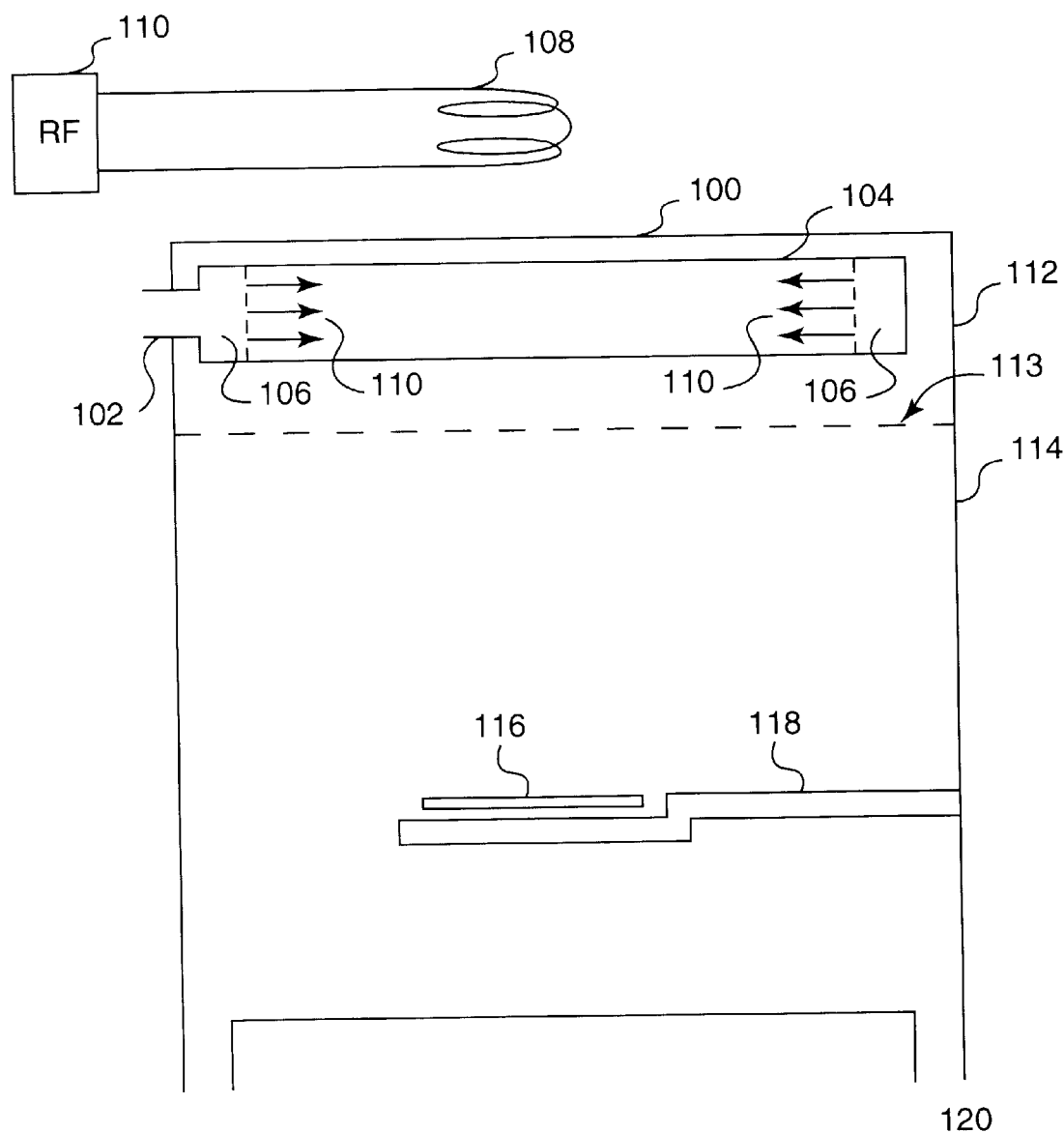
FIG. 1 shows, in one embodiment, an example of a plasma processing chamber.

It should be noted that, although plasma generating region 112 and plasma diffusion region 114 are shown demarcated by dashed line 113 for the purpose of illustration in FIGS. 1 and 2, the physical border of plasma generating region 112 is not so sharp. Plasma generation decreases with distance from plasma generating element 108, but may not completely die out for some distance. Plasma generation region 112 is therefore physically defined as the region in which substantially all plasma generation occurs. When conductive grid 200 is located substantially outside plasma generating region 112, significant plasma generation does not occur within the holes. Conductive grid 200 may be located in a region where some plasma generation occurs, and plasma ions generated upstream from the grid will still be extracted. It is also possible to make the spaces within conductive grid 200 smaller than the mean free path of the ions to inhibit plasma generation within the spaces.

Placement of conductive grid 200 substantially within plasma diffusion region 114 and substantially outside plasma generating region 112 enables conductive grid 200 to extract ions from substantially all of the plasma generated. Conductive grid 200 may, however, consistently with this invention, be placed in a region where some plasma generation occurs, so long as the quantity of ions which cannot be extracted by conductive grid 200 as a result is not large enough to cause an unacceptable level of wafer charging.

The ions are trapped by the grid, but a grid material is chosen with a low sticking coefficient for the free radicals so that the reactive free radicals in the plasma are able to pass through conductive grid 200. Conductive grid 200 is connected to ground by a line 202, which includes a node 203. Node 203 is discussed in more detail in connection with FIG. 4. Conductive grid 200 is shown as substantially spanning the interior cross section of plasma processing chamber 100. A set of gaps 204 are permissible near the sides of plasma processing chamber 100. Some ions may pass through 204 without negating the benefit of the invention. It is only required that enough ions are extracted by conductive grid 200 so that excessive charging of wafer 116 does not occur, and damage due to the antenna effect is avoided.

Figure 3:
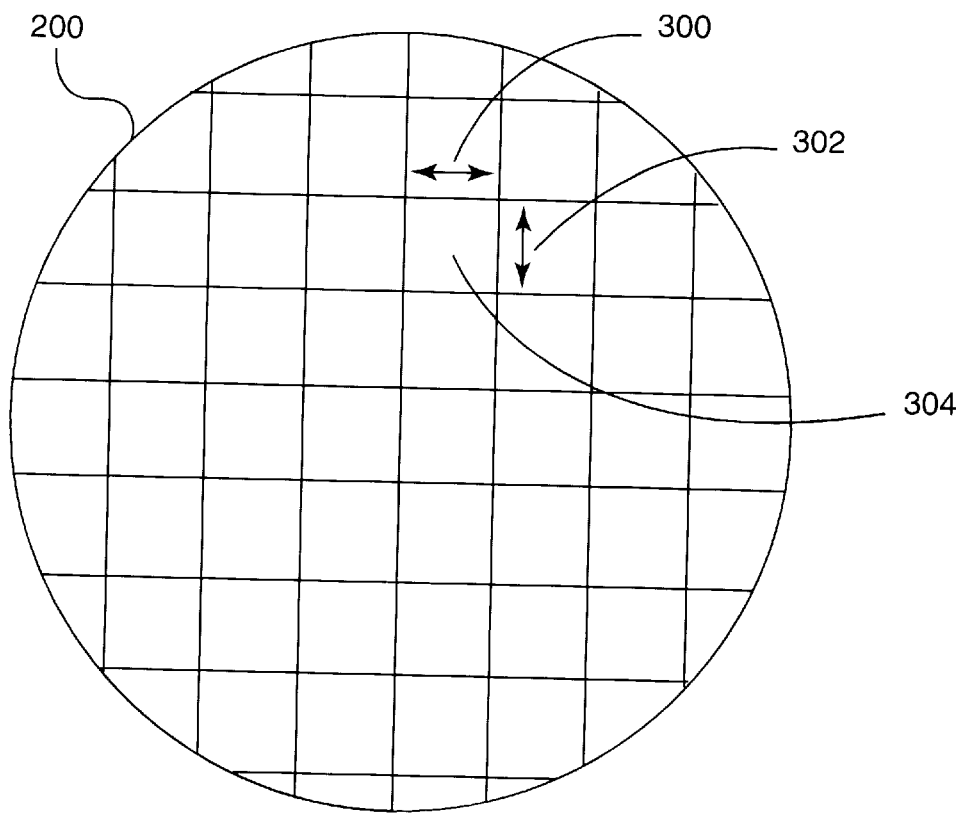
FIG. 3 shows, in one embodiment, a conductive grid.

One embodiment of conductive grid 200 is shown in greater detail in FIG. 3. Conductive grid 200 has a horizontal grid spacing 300 and a vertical grid spacing 302. The grid spacing defines the size and shape of a series of holes 304. In one embodiment, the grid shape is square, so that horizontal grid spacing 300 and vertical grid spacing 302 are equal. Other grid pattern shapes, such as a rectangle, diamond or honeycomb shape could be used as well. Conductive grid 200 is shown formed from crossed wires with spaces between the wires. Conductive grid 200 may also be formed by starting with a conductive plate and drilling holes in the plate in either a regular or an irregular pattern. In one embodiment, the grid material used is 035 gauge 5000 series aluminum wire. It will be apparent to one of ordinary skill that other metal alloys or suitable conductive materials could be used as well. Aluminum is a good choice because of its high sputtering threshold/low sputtering yield. It is desirable to use a material with a high sputtering threshold/low sputtering yield because it is undesirable for the grid material to sputter off during processing and deposit on the wafer being processed.

Grid spacings from about 1.5 mm×1.5 mm to about 12.7 mm×12.7 mm were found to work different embodiments. 6.9 mm is used for horizontal grid spacing 300 and vertical grid spacing 302 with an aluminum grid made of 035 gauge 5000 series aluminum wire in one embodiment at a pressure of 1 torr and a temperature within the chamber from about 30 to 240 degrees Centigrade for a plasma comprised of oxygen, water vapor and carbon tetrafluoride. The optimum grid spacing varies according to grid shape, grid material, grid wire size, the plasma process gases, the pressure, and the temperature inside the chamber. For given conditions, grid spacing must be judiciously chosen so that it is small enough to adequately reduce the flux of ions through it, but large enough to prevent excessive reduction in the flux of free radicals through the grid. If a large proportion of the free radicals cannot pass through the grid, then processing of wafer 116 may become too slow or inefficient.

The thickness of the grid wires which make up conductive grid 200 varies in different embodiments. A round cross section wire is used in one embodiment, but other cross section shapes such as oval or square cross sections are used in other embodiments.

Figure 4:
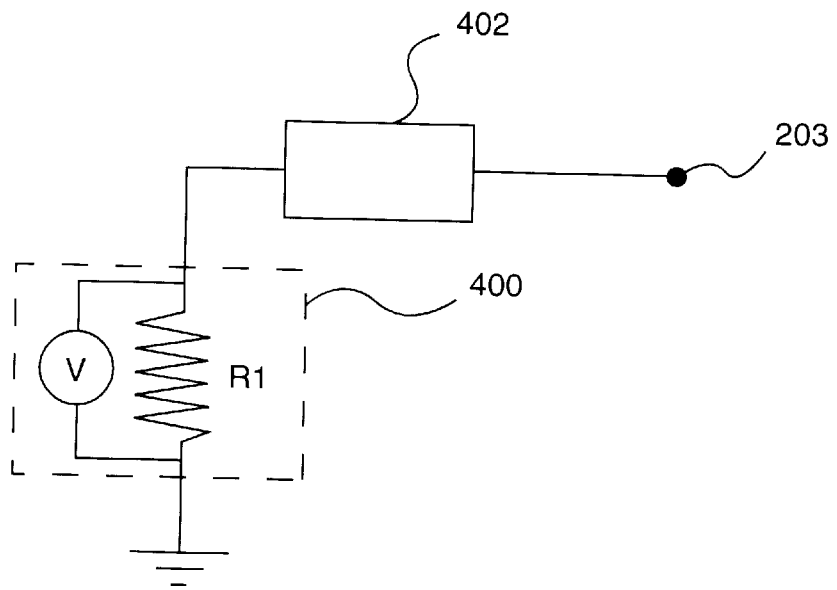
FIG. 4 shows, in one embodiment, a current measuring circuit.
Figure 1:
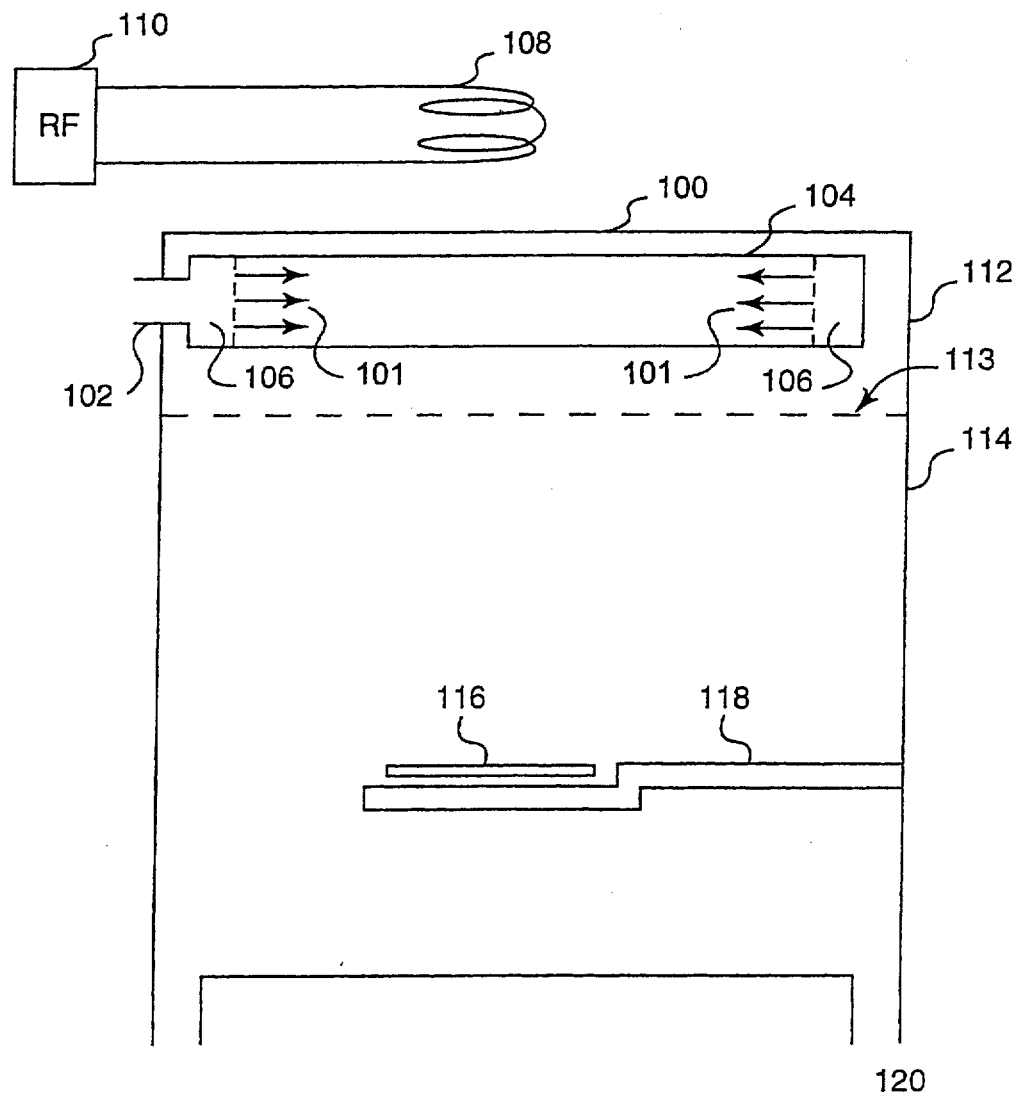

Optimum grid, shape, material, and spacing can be determined for a given set of conditions using the circuit shown in FIG. 4. A current measuring circuit 400 is inserted at node 203 between conductive grid 200 and ground. The purpose of current measuring circuit 400 is to measure the current caused by ions extracted by conductive grid 200. In the current embodiment, Current measuring circuit 400 is shown measuring a voltage across resistance R1 to determine the current. Other current measuring techniques will be apparent to those skilled in the art. From the current measured, the number of ions that conductive grid 200 extracts and prevents from reaching wafer 116 can be measured.

In one embodiment, conductive grid 200 is grounded. This prevents ions from being repelled by an electric field caused by charge on the grid. If conductive grid 200 were allowed to float, then the ions extracted by conductive grid 200 would charge it to a potential level at which the grid would repel the ions and no longer extract ions. In other embodiements, conductive grid 200 may be connected to a positive potential less than the potential at which the grid will no longer extract ions. In one embodiment, R1 is chosen to be small, so that for a given current, the voltage drop across R1 is negligible and conductive grid 200 is effectively grounded. Conductive grid 200, therefore, does not repel positively charged ions and can efficiently extract them.

An RF filter 402 is used in conjunction with current measuring circuit 400 to remove RF noise from the circuit in one embodiment. The current which is desired to be measured is the DC current caused by the combination of ions on the surface of conductive grid 200. RF filer 402 helps to filter out any radiated noise from RF power source 110 or other sources. Using current measuring circuit 400, it is possible to determine optimal grid characteristics for any given conditions. Different grid materials, spacing, and shapes can be tested, and the number of ions extracted can be determined using current measuring circuit 400. Wafer 116 itself or a test structure or sample located in plasma diffusion region 114 may be analyzed after processing with different grids, to determine the extent that free radicals were blocked and plasma processing was slowed down by conductive grid 200. Thus, a functional conductive grid can be readily determined for any set of conditions. Current measuring circuit 400 may also be used to monitor grid performance and detect possible grid degradation during processing.

While this invention has been described in terms of several embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for processing a wafer in a plasma processing chamber, said plasma processing chamber being configured for containing free radicals and ions when a plasma is struck from a plasma source gas, comprising:
    providing, within said chamber, a plasma generating region and a plasma diffusion region;
    providing, within said plasma diffusion region, a conductive grid between said wafer and said plasma generating region; and
    allowing a portion of said plasma to diffuse through said conductive grid within said plasma processing chamber said conductive grid being configured for capturing a portion of said ions, thereby preventing said portion of said ions from reaching said wafer during processing.

2. The method of claim 1 wherein said conductive grid comprises a metal mesh.

3. The method of claim 2 wherein said metal mesh comprises an aluminum mesh.

4. The method of claim 1 wherein said conductive grid has a grid spacing and said grid spacing is between about 1.5 mm and about 12.7 mm.

5. The method of claim 1 wherein said conductive grid is grounded.

6. A method of reducing charging of a wafer during plasma processing comprising:
    providing a plasma processing chamber having a plasma generating region and a plasma diffusion region,
    introducing a reactant gas into said plasma generating region,
    striking a plasma with said reactant gas within said plasma generating region, said plasma including uncharged free radicals and ions,
    providing said wafer for processing within said plasma diffusion region,
    providing a conductive grid substantially within said plasma diffusion region and between said wafer and said plasma generating region, said conductive grid separating said wafer from said plasma generating region,
    allowing a portion of said plasma to diffuse toward said wafer through said conductive grid, and
    extracting a portion of said ions with said conductive grid so that said portion of said ions do not reach said wafer.

7. The method of claim 6 wherein diffusing said plasma toward said wafer through said conductive grid includes diffusing a substantial portion of said free radicals through said conductive grid without said free radicals combining on the surface of said conductive grid.

8. The method of claim 6 wherein extracting said portion of said ions includes preventing at least 50% of the ions incident on said grid from passing through said grid.

9. The method of claim 6 wherein providing a conductive grid within said plasma diffusion region includes providing a conductive grid with a grid spacing between about 1.5 mm and about 12.5 mm.

10. The method of claim 6 further including measuring said portion of said ions which do not reach said wafer.

11. The method of claim 6 wherein said conductive grid is grounded.

12. The method of claim 6 wherein providing a conductive grid within said plasma diffusion region includes providing an aluminum conductive grid.

13. A plasma processing chamber comprising:
    a plasma generating region,
    a plasma generating element configured to cause a plasma including ions and free radicals to be formed in said plasma generating region,
    a plasma diffusion region configured so that plasma generated in said plasma generating region may diffuse through said plasma diffusion region,
    a wafer holding region located within said plasma diffusion region, and
    a conductive grid located within said plasma diffusion region between said wafer holding region and said plasma generating region, said conductive grid including a mesh configured to trap a portion of said ions,
    whereby a portion of said ions is prevented from diffusing through said diffusion region to reach said wafer holding region.

14. The apparatus of claim 13 wherein said conductive grid within said plasma diffusion region has a grid spacing between about 1.5 mm and about 12.5 mm.

15. The apparatus of claim 13 further including a current measuring device configured to measure the said portion of said ions which are prevented from diffusing through said plasma diffusion region to reach said wafer holding region.

16. The apparatus of method of claim 13 wherein said conductive grid within said plasma diffusion region is grounded.

17. The apparatus of claim 13 wherein said conductive grid within said plasma diffusion region is an aluminum conductive grid.

18. A wafer plasma processing chamber comprising:
a plasma generating region,
means for generating a plasma including ions and free radicals within said plasma generating region,
a plasma diffusion region through which said plasma is diffused,
a wafer holding region within said plasma diffusion region,
conductive grid means, within said plasma diffusion region, for blocking a portion of said ions from diffusing toward said wafer holding region.

19. The apparatus of claim 18 wherein said conductive grid means is a conductive grid which has a grid spacing between 1.5 mm and 12.5 mm.

20. The apparatus of claim 18 further including current measuring means for measuring said portion of said ions which are blocked from diffusing toward said wafer.

21. The apparatus of claim 18 wherein said conductive grid means is grounded.

22. The apparatus of claim 18 wherein said conductive grid means is an aluminum conductive grid.

* * * * *

UNITED STATES PATENT AND TRADEMARK OFFICE
CERTIFICATE OF CORRECTION

PATENT NO. : 5,904,571
DATED : May 18, 1999
INVENTOR(S) : Roger Patrick, et al.

It is certified that error appears in the above-identified patent and that said Letters Patent is hereby corrected as shown below:

Drawing sheet, consisting of Fig. 1, should be deleted to be replaced with the Drawing Sheet, consisting of Fig. 1, as shown on the attached page.

Signed and Sealed this

Twelfth Day of September, 2000

Attest:

Q. TODD DICKINSON

*Attesting Officer*        *Director of Patents and Trademarks*